United States Patent
Ben-Tal et al.

(10) Patent No.: US 10,942,542 B2
(45) Date of Patent: Mar. 9, 2021

(54) DATA TRANSFER BY MODULATING CLOCK SIGNAL

(71) Applicant: INTEL IP CORPORATION, Santa Clara, CA (US)

(72) Inventors: Rafi Ben-Tal, Givat-Ada (IL); Junlin Yan, Düsseldorf (DE)

(73) Assignee: INTEL IP CORPORATION, Santa Clara, CA (US)

( * ) Notice: Subject to any disclaimer, the term of this patent is extended or adjusted under 35 U.S.C. 154(b) by 1062 days.

(21) Appl. No.: 15/199,495

(22) Filed: Jun. 30, 2016

(65) Prior Publication Data

US 2018/0004245 A1 Jan. 4, 2018

(51) Int. Cl.
| G06F 1/10 | (2006.01) |
| G06F 1/14 | (2006.01) |
| H04L 25/49 | (2006.01) |
| H03B 5/32 | (2006.01) |
| H04L 7/00 | (2006.01) |

(52) U.S. Cl.
CPC ............... *G06F 1/14* (2013.01); *H03B 5/32* (2013.01); *H04L 7/0037* (2013.01); *H04L 25/4902* (2013.01); *H04L 25/4904* (2013.01)

(58) Field of Classification Search
None
See application file for complete search history.

(56) References Cited

U.S. PATENT DOCUMENTS

| 4,694,472 A | 9/1987 | Torok et al. | |
| 9,077,243 B2 * | 7/2015 | Bernardinis | H02M 3/1584 |
| 2005/0120258 A1 * | 6/2005 | Sohda | G06F 1/12 |
| | | | 713/400 |
| 2006/0093029 A1 | 5/2006 | Becker et al. | |
| 2006/0217927 A1 | 9/2006 | Flynn | |
| 2008/0162062 A1 | 7/2008 | Kelkar et al. | |

(Continued)

FOREIGN PATENT DOCUMENTS

EP 0805579 A2 11/1997

OTHER PUBLICATIONS

International Search Report and Written Opinion dated Sep. 8, 2017 for International Application No. PCT/US2017/035031, 17 pages.

(Continued)

*Primary Examiner* — Fahmida Rahman
(74) *Attorney, Agent, or Firm* — Schwabe, Williamson & Wyatt, P.C.

(57) ABSTRACT

Embodiments include apparatuses, systems, and methods associated with modulating a clock signal to encode information. A system may include a plurality of dies including a first die. The first die may include a real time clock (RTC) circuit to receive clock information associated with a shared clock signal that is shared among the plurality of dies, and modulate a RTC signal to encode the clock information. The first die may further include an output terminal coupled to the RTC circuit to pass the modulated RTC signal to one or more other dies of the plurality of dies. A second die of the plurality of dies may include a decoder to receive the modulated RTC signal and extract the clock information. The second die may adjust and/or condition the shared clock signal based on the received clock information. Other embodiments may be described and claimed.

22 Claims, 3 Drawing Sheets

(56) References Cited

U.S. PATENT DOCUMENTS

| | | |
|---|---|---|
| 2008/0315930 A1 | 12/2008 | Gomm |
| 2012/0266008 A1 | 10/2012 | Coteus et al. |
| 2013/0219199 A1* | 8/2013 | Roy ........................ G06F 1/324 |
| | | 713/322 |
| 2015/0121110 A1 | 4/2015 | Sima |
| 2016/0034203 A1 | 2/2016 | Jang et al. |
| 2016/0062427 A1 | 3/2016 | Chen et al. |
| 2016/0116515 A1* | 4/2016 | Hackett .................. G01R 22/04 |
| | | 368/202 |

OTHER PUBLICATIONS

Extended European Search Report dated Feb. 6, 2020 for EP Application No. 17820798.1, 10 pages.

\* cited by examiner

DATA TRANSFER BY MODULATING CLOCK SIGNAL

FIELD

Embodiments of the present invention relate generally to the technical field of electronic circuits, and more particularly to data transfer by modulating a clock signal.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

In many computing systems, two or more dies of the computing system need to communicate with one another. Typically, a dedicated interface is used for the two or more dies to communicate, which requires additional input/output contacts (e.g., balls/pins) on each die.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
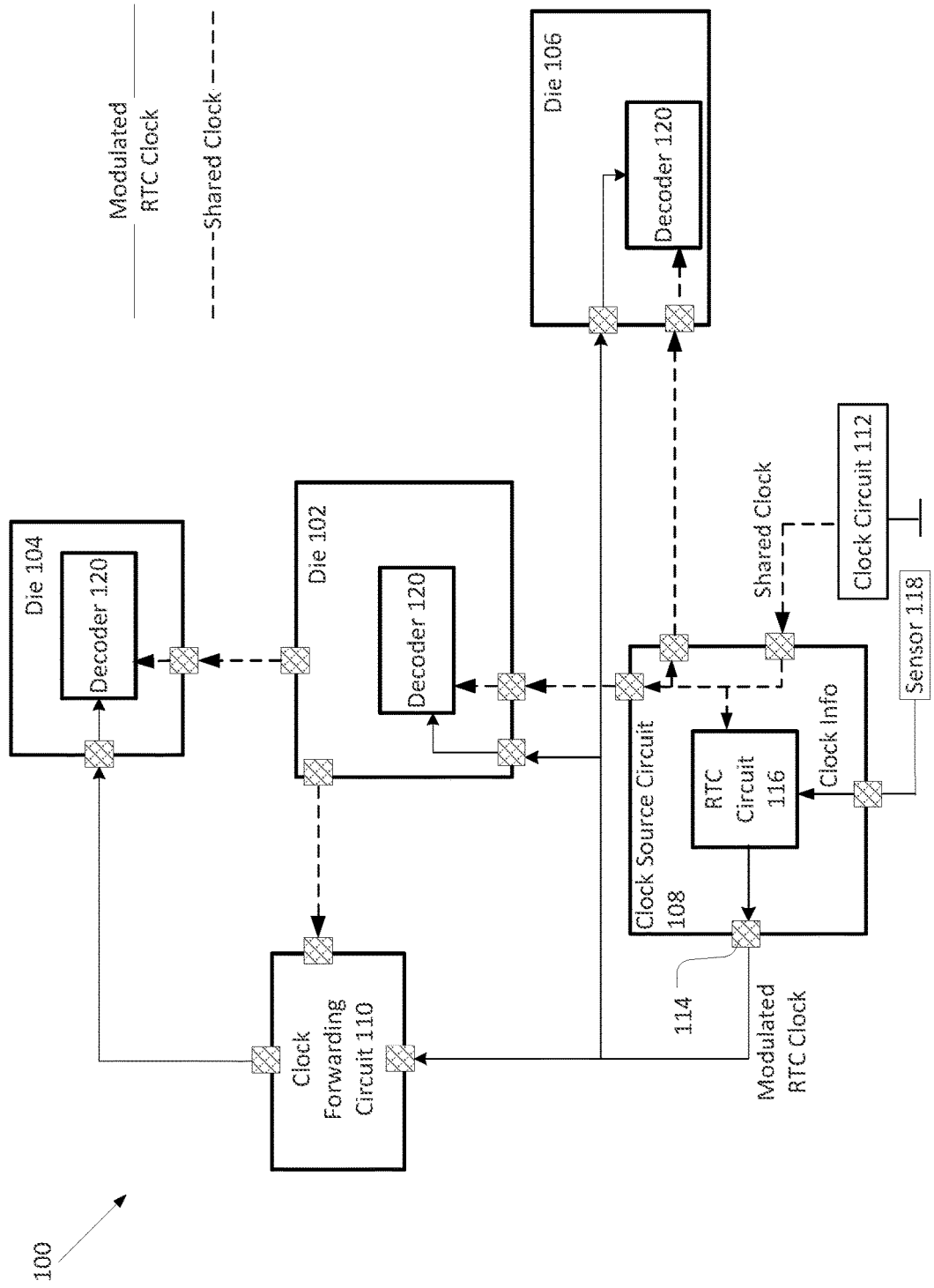
FIG. 1 schematically illustrates a computing system including a clock source circuit that modulates a real time clock signal, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Embodiments include apparatuses, systems, and methods associated with modulating a clock signal to encode information. A system may include a plurality of circuit dies including a first circuit die. The first circuit die may include a real time clock (RTC) circuit to receive clock information associated with a shared clock signal that is shared among the plurality of circuit dies, and modulate a RTC signal to encode the clock information. The RTC circuit may modulate the RTC signal using pulse width modulation (e.g., by adjusting the timing of the falling edge of the RTC signal). The first circuit die may further include an output terminal coupled to the RTC circuit to pass the modulated RTC signal to one or more other circuit dies of the plurality of circuit dies. A second circuit die of the plurality of circuit dies may include a decoder to receive the RTC signal and extract the clock information. The decoder and/or another circuit of the second circuit die may adjust and/or condition the shared clock signal based on the received clock information.

FIG. 1 illustrates a computing system 100 (hereinafter "system 100") in accordance with various embodiments. System 100 may include a plurality of dies 102, 104, and/or 106. The system 100 may further include a clock source circuit 108. In some embodiments, the system 100 may further include a clock forwarding circuit 110. In embodiments, the clock source circuit 108 and/or clock forwarding circuit 110 may be on different dies than the dies 102, 104, and 106. In other embodiments, the clock source circuit 108 and/or 110 may be included on die 102, die 104, and/or die 106.

In various embodiments, the dies 102, 104, and 106 may be distinct integrated circuits products. In some embodiments, two or more of dies 102, 104, and/or 106 may be disposed on a same circuit board (e.g. printed circuit board 402 of FIG. 4). The dies 102, 104, and/or 106 may include respective integrated circuits. For example, in one non-limiting example, die 102 may be a processor and/or system-on-chip (SoC), the die 104 may be a near-field communication (NFC) chip, and/or die 106 may be a cellular radio frequency (RF) chip. Additionally, or alternatively, the clock source circuit 108 may be a connectivity (CNV) chip. The CNV chip may include RF circuitry to handle communication of one or more wireless signals, such as one or more of Bluetooth, wireless local area network (WLAN, e.g., WiFi), frequency modulation (FM) radio, global navigation satellite system (GNSS, e.g., global positioning system (GPS)) signals, and/or other wireless signals. Additionally, or alternatively, the clock forwarding circuit 110 may be a power management integrated circuit (PMIC). The PMIC may generate one or more power voltages and supply them to one or more of the die 102, die 104, die 106, and/or clock source circuit 108. It will be apparent that the techniques described herein may be used for any system that uses a shared clock signal.

In various embodiments, the system 100 may further include a clock circuit 112 coupled to the clock source circuit 108. In some embodiments, the clock circuit 112 may include a crystal oscillator (XO). The clock circuit 112 may generate a shared clock signal (e.g., an XO clock signal and/or a fast clock signal) and pass the shared clock signal to the clock source circuit 108. The shared clock signal may have any suitable frequency, such as a frequency of about 19 Megahertz (MHz) to about 52 MHz. In one embodiment, the frequency of the shared clock signal may be about 38.4 MHz.

In various embodiments, the clock source circuit 108 may include a real time clock (RTC) circuit 116. The RTC circuit 116 may modulate a RTC signal to encode information in the RTC signal. The information may include, for example, clock information associated with the shared clock signal and/or the RTC signal. The clock information may be received by the RTC circuit 116 from one or more other circuits, such as the clock circuit 112, one or more sensors, or one or more control circuits (not shown). For example, in some embodiments, the system 100 may further include a temperature sensor 118 coupled to the clock source circuit 108. The temperature sensor 118 may detect the temperature at the first clock circuit 112 (e.g., XO temperature). The RTC circuit 116 may modulate the RTC signal to encode the detected temperature value on to the RTC signal. The die 102, die 104, and/or die 106 may include respective decoders 120 to decode the modulated RTC signal to obtain the clock information.

In some embodiments, the RTC circuit 116 may generate the RTC signal (e.g., generate the RTC signal and then modulate the generated RTC signal or directly generate the modulated RTC signal). For example, the RTC circuit 116 may generate the RTC signal based on the shared clock signal. Alternatively, another clock circuit may generate the RTC signal and pass the RTC signal to the RTC circuit 116, and the RTC circuit 116 may modulate the received RTC signal to generate the modulated RTC signal.

The RTC signal may have any suitable frequency, but the frequency of the RTC signal may generally be lower than the frequency of the shared clock signal. For example, in one non-limiting embodiment, the RTC signal may have a frequency of about 32 kiloHertz (e.g., 32.768 kHz). The RTC signal may be used by components of the system 100 to, for example, measure a period of time and/or otherwise keep track of time. The shared clock signal may be used by components of the system 100 as a reference clock for a RF phase locked loop (PLL), to control logic operations of the circuitry of system 100, to synchronize operations of the system 100 and/or for another suitable purpose.

In various embodiments, the clock source circuit 108 may pass the shared clock signal and the modulated RTC signal to the die 102, die 104, die 106, and/or clock forwarding circuit 110 (e.g., via an output terminal 114 coupled to the RTC circuit 116). The shared clock signal and modulated RTC signal may be passed directly or indirectly (e.g., via another circuit block of system 100). For example, as shown in FIG. 1, the clock source circuit 108 may pass the shared clock signal directly to the die 102 and die 106 via the output terminal 114, and the die 102 may pass the shared clock signal to the die 104 and the clock forwarding circuit 110. As further shown in FIG. 1, the clock source circuit 108 may pass the modulated RTC signal directly to the die 102, die 106, and clock forwarding circuit 110, and the clock forwarding circuit 110 may pass the modulated RTC signal to the die 104. It will be apparent that other arrangements may be used to distribute the shared clock signal and/or modulated RTC signal to the components of system 100.

In addition to or instead of clock temperature, the clock information may include information related to one or more characteristics of the first clock circuit 112 (e.g., the XO), a data rise time, calibration information (e.g., the frequency tuning setting and/or the residue error from calibration), a wakeup time of the first clock circuit 112, and/or other suitable clock information. The circuit blocks of system 100 (e.g., dies 102, 104, and 106, clock source circuit 108, and clock forwarding circuit 110) may use the clock information to adjust/condition the fast clock signal and/or adjust operation of circuit devices. For example, the frequency of the shared clock signal may drift with a change in temperature according to a known temperature curve. Accordingly, the respective circuit blocks of the system 100 may account for and/or correct the frequency drift in the shared clock signal based on the temperature value received via the modulated RTC signal. For example, the circuit blocks of the system 100 that receive the shared clock signal may adjust local oscillators to account for the offset on the shared clock signal.

Accordingly, the system 100 may use the existing RTC interface to pass clock information (e.g., temperature) associated with the shared fast clock signal. Thus, the system 100 may not require a separate interface (e.g., with separate contacts and transmission lines) to pass the clock information.

In various embodiments, the RTC circuit 116 of the clock source circuit may use pulse width modulation (PWM) to modulate the RTC signal. The PWM may be performed by adjusting the timing of a falling edge of the RTC signal while maintaining the timing of a rising edge of the RTC signal constant (e.g., periodic). Since the rising edge is typically used to trigger RTC operations of the circuitry, the modulated RTC signal will not interfere with the operation of circuits that use the RTC signal. Additionally, circuits that do not include a decoder to decode the information encoded by the modulated RTC signal can still use the modulated RTC signal for RTC operations.

The RTC circuit 116 may include any suitable circuitry to generate the RTC signal and/or modulate the RTC signal. For example, in some embodiments, the RTC circuit 116 may include a multi-stage noise shaping (MASH) circuit (e.g., a first order MASH circuit) to generate the modulated RTC signal.

Figure 2:
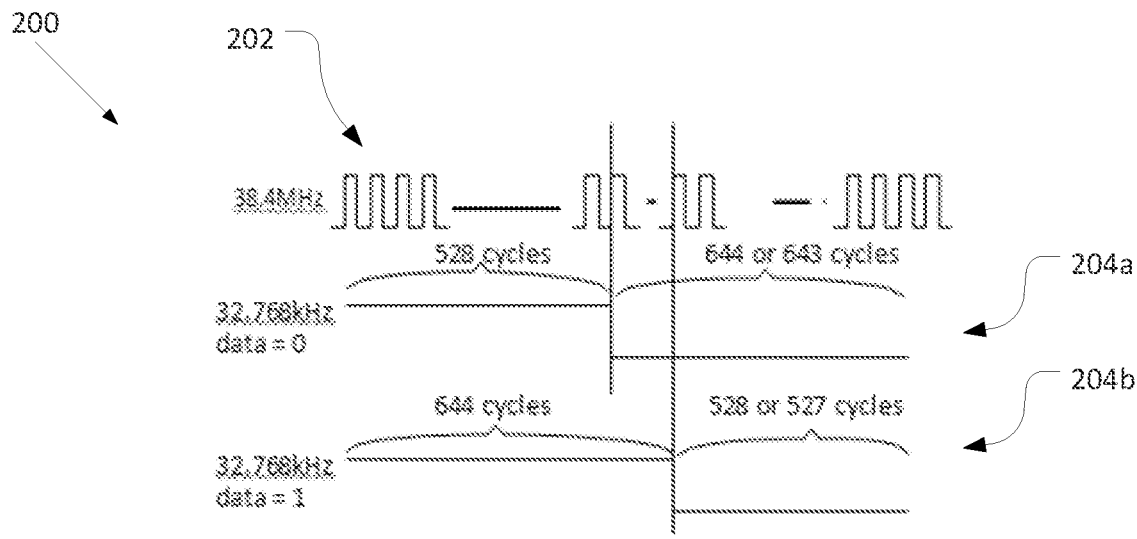
FIG. 2 illustrates a pulse width modulation scheme that may be used to modulate a real time clock signal, in accordance with various embodiments.

FIG. 2 illustrates an example PWM scheme 200 that may be used by an RTC circuit (e.g., by the RTC circuit 116) in accordance with various embodiments. The PWM scheme 200 is illustrated with reference to a shared clock signal 202 that has a frequency of 38.4 MHz and a RTC signal 204a-b that has a frequency of 32.768 kHz. The RTC circuit may provide the modulated RTC signal with a first duty cycle (as shown for signal 204a) to indicate that the modulated RTC signal encodes a first logic value (e.g., logic 0), and may provide the modulated RTC signal with a second duty cycle (as shown for signal 204b) to indicate that the modulated RTC signal encodes a second logic value (e.g., logic 1). The duty cycle may also be described with reference to a pulse width that corresponds to a time (e.g., number of cycles of the shared clock signal) for which the RTC signal goes high. The RTC circuit may control the duty cycle of the modulated RTC signal using the shared clock signal.

For example, as shown in FIG. 2, to encode a logic 0 bit, the RTC circuit may control the modulated RTC signal to have a duty cycle of about 45% (e.g., to be high for about 528 cycles of the shared clock signal and low for about 644 or 633 cycles of the shared clock signal). To encode a logic 1 bit, the RTC circuit may control the modulated RTC signal to have a duty cycle of about 55% (e.g., to be high for about 644 cycles of the shared clock signal and low for about 528 or 527 of the shared clock signal). It will be apparent that other values of the duty cycles, number of cycles of the shared clock signal, and/or frequencies of the shared clock signal and/or RTC signal may be used in other embodiments.

Figure 3:
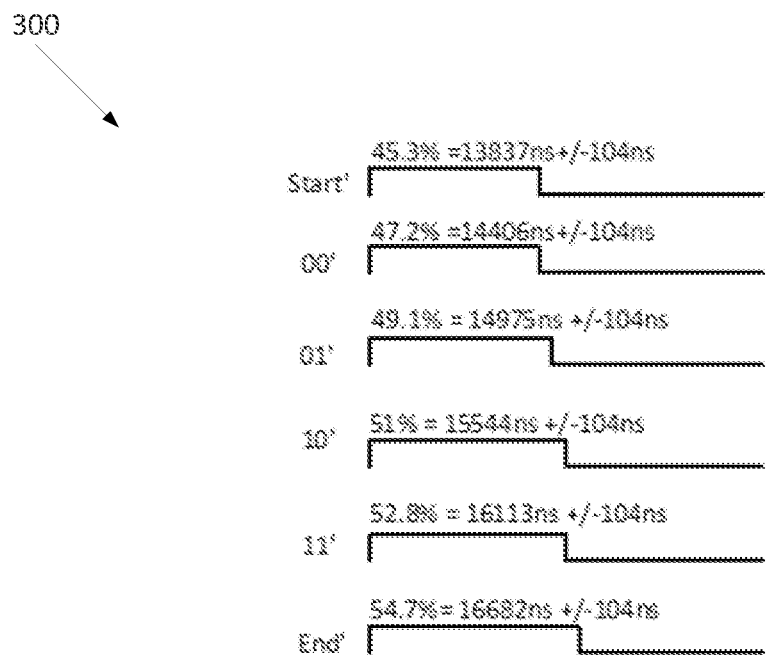
FIG. 3 illustrates another pulse width modulation scheme that may be used to modulate a real time clock signal, in accordance with various embodiments.

FIG. 3 illustrates another PWM scheme 300 that may be used by an RTC circuit (e.g., by the RTC circuit 116) in accordance with various embodiments. The PWM scheme 300 is illustrated with reference to a shared clock signal that has a frequency of 38.4 MHz and a RTC signal that has a frequency of 32.768 kHz.

FIG. 3 illustrates the modulated RTC signal with a plurality of duty cycles. The scheme 300 may enable the RTC circuit to encode multiple bits per period of the RTC signal based on the duty cycle of the modulated RTC signal. Additionally, or alternatively, the scheme 300 may enable RTC circuit to indicate a start of a message and/or an end of a message.

For example, as shown in FIG. 3, the RTC signal may have a first duty cycle (e.g., about 45.3%) to indicate a start of a message, a second duty cycle (e.g., about 47.2%) to indicate a 00 bit sequence, a third duty cycle (e.g., about 49.1%) to indicate a 01 bit sequence, a fourth duty cycle (e.g., about 51%) to indicate a 10 bit sequence, a fifth duty cycle (e.g., about 52.8%) to indicate a 11 bit sequence, and/or a sixth duty cycle (e.g., about 54.7%) to indicate an end of message. In some embodiments, to transmit a message indicating the clock information, the RTC circuit may first transmit the start indicator (e.g., provide the RTC signal with the first duty cycle), then transmit the bits encoding the clock information, and then transmit the end indicator (e.g., provide the RTC signal with the sixth duty cycle) to indicate the end of the message. In some embodiments, the message may further include one or more other elements, such as a header or other information.

When using the shared clock signal to determine the duty cycle of the modulated RTC signal, the worst case resolution for the decoder 120 may be 2 clock periods of the shared clock signal. For a shared clock signal with a frequency that may be as low as 19.2 MHz, 2 clock periods of the shared clock signal are about 104 nanoseconds (ns). Accordingly, the PWM scheme 300 may define the first-sixth duty cycles as ranges according to the worst case resolution (e.g., the nominal value +/−104 ns). The PWM scheme 300 may enable about 64 kilobits per second (Kb/s) broadcasting of data on the modulated RTC signal.

In some embodiments, the RTC circuit may maintain the RTC signal with the duty cycle that corresponds to the end indicator (e.g., the sixth duty cycle) after the end of the message and until the start of the next message. The individual messages may have any suitable length, message header, content, and/or error correction coding (ECC). For example, in some embodiments, the length of the individual messages may be about 2 bits to about 64 bits. One or more characteristics of the messages may be defined by software on the clock source circuit 108 and/or dies 102, 104, and/or 106.

In some embodiments, the RTC circuit may use a PWM scheme that varies the duty cycle of the modulated RTC signal over a range of values that is between about 45% and 55% (as is the case for PWM schemes 200 and 300). Such a range meets the requirements for legacy RTC duty cycle. Other embodiments may use a different range of duty cycle values.

In some embodiments, the shared clock signal may be inactive during a sleep state of the system 100. During the sleep state, the clock source circuit 108 may pass an unmodulated RTC signal that is generated by another clock circuit (e.g., a crystal oscillator).

Referring again to FIG. 1, as discussed above, one or more of the components of the system 100 that receive the modulated RTC signal may include a decoder 120. The decoder 120 may extract the clock information from the modulated RTC signal based on the duty cycle of the modulated RTC signal. For example, the decoder 120 may determine the duty cycle of the modulated RTC signal using the shared clock signal to measure the high time and/or low time of the modulated RTC signal (e.g., counting the number of cycles of the shared clock signal for which the modulated RTC signal is high and/or counting the number of cycles of the shared clock signal for which the modulated RTC signal is low over a cycle of the modulated RTC signal) and comparing the high time to the low time to determine the duty cycle.

Figure 4:
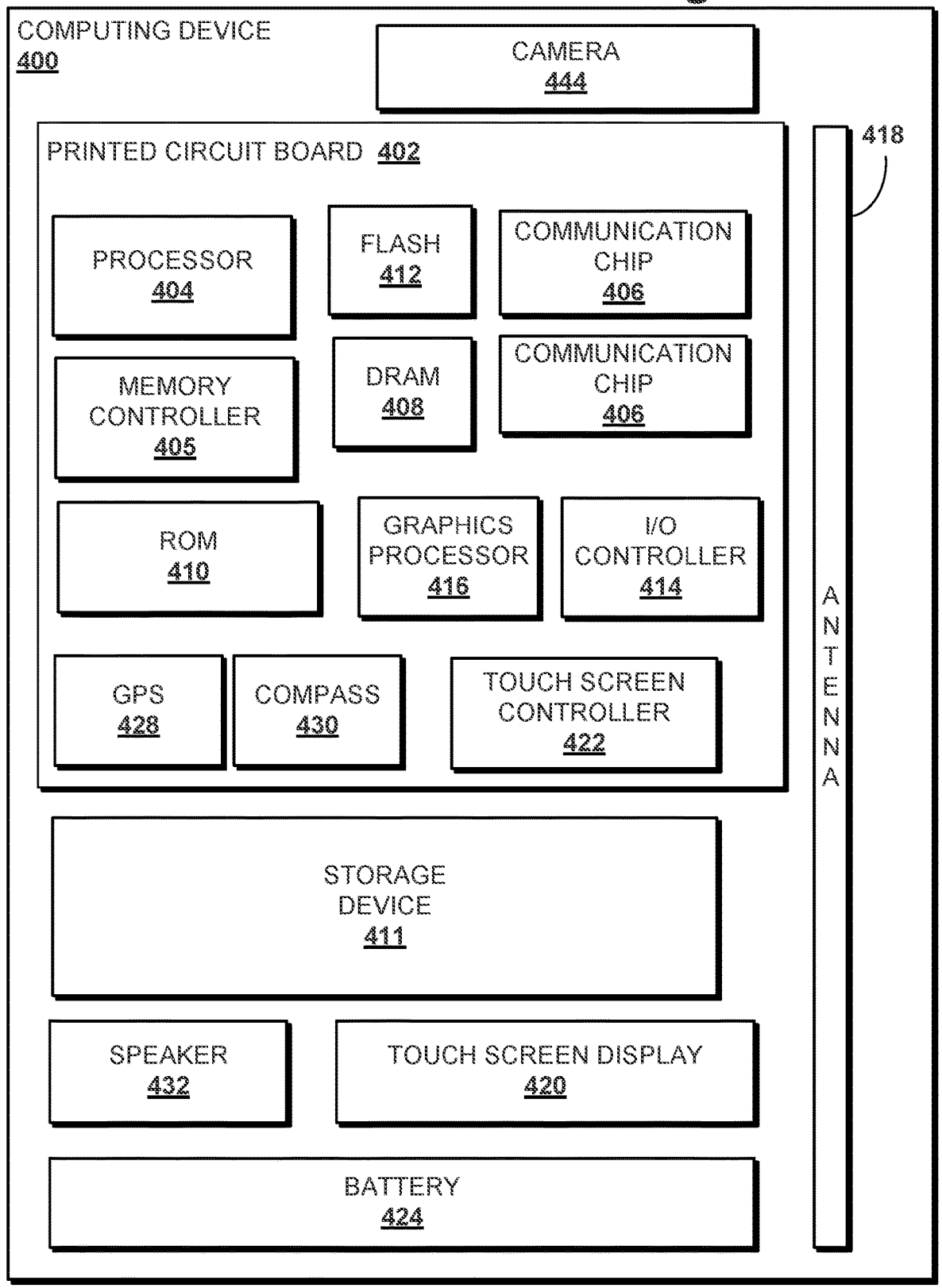
FIG. 4 illustrates an example system configured to employ the apparatuses and methods described herein, in accordance with various embodiments.

FIG. 4 illustrates an example computing device 400 that may employ the systems, apparatuses and/or methods described herein (e.g., system 100, PWM scheme 200, and/or PWM scheme 300), in accordance with various embodiments. As shown, computing device 400 may include a number of components, such as one or more processor(s) 404 (one shown) and at least one communication chip 406. In various embodiments, the one or more processor(s) 404 each may include one or more processor cores. In various embodiments, the at least one communication chip 406 may be physically and electrically coupled to the one or more processor(s) 404. In further implementations, the communication chip 406 may be part of the one or more processor(s) 404. In various embodiments, computing device 400 may include printed circuit board (PCB) 402. For these embodiments, the one or more processor(s) 404 and communication chip 406 may be disposed thereon. In alternate embodiments, the various components may be coupled without the employment of PCB 402.

Depending on its applications, computing device 400 may include other components that may or may not be physically and electrically coupled to the PCB 402. These other components include, but are not limited to, memory controller 405, volatile memory (e.g., dynamic random access memory (DRAM) 408), non-volatile memory such as read only memory (ROM) 410, flash memory 412, storage device 411 (e.g., a hard-disk drive (HDD)), an I/O controller 414, a digital signal processor (not shown), a crypto processor (not shown), a graphics processor 416, one or more antenna 418, a display (not shown), a touch screen display 420, a touch screen controller 422, a battery 424, an audio codec (not shown), a video codec (not shown), a global positioning system (GPS) device 428, a compass 430, an accelerometer (not shown), a gyroscope (not shown), a speaker 432, a camera 434, and a mass storage device (such as hard disk drive, a solid state drive, compact disk (CD), digital versatile disk (DVD)) (not shown), and so forth. In various embodiments, the processor 404 may be integrated on the same die with other components to form a System on Chip (SoC).

In some embodiments, the one or more processor(s) 404, flash memory 412, and/or storage device 411 may include associated firmware (not shown) storing programming instructions configured to enable computing device 400, in response to execution of the programming instructions by one or more processor(s) 404, to practice all or selected aspects of the methods described herein (e.g., PWM scheme 200 and/or 300). In various embodiments, these aspects may additionally or alternatively be implemented using hardware separate from the one or more processor(s) 404, flash memory 412, or storage device 411.

In various embodiments, one or more components of the computing device 400 may correspond to components of the system 100 described herein. For example, the processor 404, communication chips 406, and/or one or more other components of the computing device 400 may correspond to components of the system 100, such as the die 102, die 104, die 106, clock source circuit 108, and/or clock forwarding circuit 110.

The communication chips 406 may enable wired and/or wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth, and a second communication chip 406 may be dedicated to longer range wireless communications such as GPS, EDGE, GPRS, CDMA, WiMAX, LTE, Ev-DO, and others.

In various implementations, the computing device 400 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 400 may be any other electronic device that processes data.

Some non-limiting Examples of various embodiments are provided below.

Example 1 is a circuit disposed on a first circuit die, the circuit comprising a real time clock (RTC) circuit to: receive clock information associated with a shared clock signal that is shared among a plurality of circuit dies including the first circuit die; and modulate a RTC signal to encode the clock information. The circuit of Example 1 further includes an output terminal coupled to the encoder to pass the modulated RTC signal to one or more other circuit dies of the plurality of circuit dies.

Example 2 is the circuit of Example 1, wherein the RTC circuit is further to receive the shared clock signal and to generate the RTC signal based on the shared clock signal.

Example 3 is the circuit of Example 1, wherein a frequency of the shared clock signal is higher than a frequency of the RTC signal.

Example 4 is the circuit of Example 1, wherein the clock information indicates a temperature associated with a clock circuit that generates the shared clock signal.

Example 5 is the circuit of Example 4, wherein the clock circuit includes a crystal oscillator.

Example 6 is the circuit of any one of Examples 1 to 5, wherein the RTC circuit is to modulate the RTC signal using pulse width modulation by adjusting a timing of a falling edge of the RTC signal.

Example 7 is the circuit of Example 6, wherein the RTC circuit is to provide the modulated RTC signal with a first duty cycle over a first cycle to indicate that a first bit encoded by the modulated RTC signal is a first logic value and is to provide the modulated RTC signal with a second duty cycle over a second cycle to indicate that a second bit encoded by the modulated RTC signal is a second logic value, wherein the second duty cycle is different than the first duty cycle and the second logic value is different than the first logic value.

Example 8 is the circuit of Example 6, wherein the modulated RTC signal is to encode a plurality of bits per cycle of the modulated RTC signal based on a pulse width of the modulated RTC signal.

Example 9 is the circuit of Example 6, wherein the modulated RTC signal further encodes a start of message indicator based on a pulse width of the modulated RTC signal.

Example 10 is the circuit of Example 9, wherein the encoder is to provide the modulated RTC signal with a pre-defined pulse width to indicate an end of a message encoded by the modulated RTC signal and wherein the encoder is to maintain the modulated RTC signal with the pre-defined pulse width until a start of a next message.

Example 11 is the circuit of Example 6, wherein all duty cycles of the modulated RTC signal used to encode the clock information are between 45% and 55%.

Example 12 is a system to communicate via a clock signal, the system comprising: a crystal oscillator to generate a shared clock signal; and a plurality of circuit dies having respective circuitry. The plurality of circuit dies include a first circuit die having a real time clock (RTC) circuit to: receive a shared clock signal that is shared among the plurality of circuit dies; receive clock information associated with the shared clock signal; generate a modulated RTC signal based on the shared clock signal, wherein the modulated RTC signal is modulated using pulse width modulation to encode the clock information; and pass the modulated RTC signal to one or more other circuit dies of the plurality of circuit dies.

Example 13 is the system of Example 12, wherein a frequency of the shared clock signal is higher than a frequency of the modulated RTC signal.

Example 14 is the system of Example 12, wherein the system further comprises a temperature sensor to detect a temperature value associated with the crystal oscillator, and wherein the clock information includes the detected temperature value.

Example 15 is the system of Example 12, wherein the RTC circuit is to generate the modulated RTC signal using pulse width modulation by adjusting a timing of a falling edge of the modulated RTC signal to indicate the encoded clock information while maintaining a timing of a rising edge of the modulated RTC signal.

Example 16 is the system of Example 12, wherein the RTC circuit is to provide the modulated RTC signal with a first duty cycle over a first cycle to indicate that a first bit encoded by the modulated RTC signal is a first logic value and is to provide the modulated RTC signal with a second duty cycle over a second cycle to indicate that a second bit encoded by the modulated RTC signal is a second logic value, wherein the second duty cycle is different than the first duty cycle and the second logic value is different than the first logic value.

Example 17 is the system of any one of Examples 12 to 16, wherein the modulated RTC signal is to encode a plurality of bits per cycle of the modulated RTC signal based on a pulse width of the modulated RTC signal.

Example 18 is the system of Example 12, wherein the RTC circuit is further to: provide the modulated RTC signal with a first pulse width to indicate a start of a message; provide the modulated RTC signal with a second pulse width to indicate an end of a message; and maintain the modulated RTC signal with the second pulse width after the end of the message and until a start of a next message.

Example 19 is the system of Example 12, wherein a duty cycle of the modulated RTC signal varies between a range of values that are between 45% and 55%.

Example 20 is the system of Example 12, wherein the plurality of circuit dies include a processor, a cellular radio frequency (RF) die, and a connectivity (CNV) die.

Example 21 is the system of Example 12, wherein the plurality of circuit dies further includes a clock forwarding die to receive the modulated RTC signal from the first circuit die and pass the modulated RTC signal to a second circuit die of the plurality of dies.

Example 22 is a circuit disposed on a first circuit die, the circuit comprising: a first input terminal to receive a shared clock signal from a second circuit die; a second input terminal to receive a modulated real time clock (RTC) signal that encodes clock information associated with the shared clock signal; and a decoder to decode the clock information from the modulated RTC signal.

Example 23 is the circuit of Example 22, wherein the modulated RTC signal is encoded using pulse width modulation, and wherein the decoder is to determine a duty cycle of the modulated RTC signal based on the shared clock signal.

Example 24 is the circuit of Example 22, wherein the clock information indicates a temperature associated with a crystal oscillator that generates the shared clock signal, and wherein the decoder is further to adjust the shared clock signal based on the temperature.

Example 25 is the circuit of any one of Examples 22 to 24, wherein the modulated RTC signal encodes multiple bits per cycle of the modulated RTC signal.

Example 26 is an apparatus to communicate via a real time clock signal (RTC), the apparatus comprising: means to receive clock information associated with a shared clock signal that is to be used by a plurality of circuit dies, wherein the clock information includes temperature information; means to modulate RTC signal with the clock information by adjusting a timing of a falling edge of the RTC signal, wherein the RTC signal has a frequency that is less than a frequency of the shared clock signal; and means to distribute the modulated RTC signal to the plurality of circuit dies.

Example 27 is the apparatus of Example 26, wherein the means to modulate the RTC signal includes: means to provide the modulated RTC signal with a first duty cycle over a first cycle to indicate that a first bit encoded by the modulated RTC signal is a first logic value; and means to provide the modulated RTC signal with a second duty cycle over a second cycle to indicate that a second bit encoded by the modulated RTC signal is a second logic value, wherein the second duty cycle is different than the first duty cycle and the second logic value is different than the first logic value.

Example 28 is the apparatus of Example 26, wherein the modulated RTC signal is to encode a plurality of bits per cycle of the modulated RTC signal based on a duty cycle of the modulated RTC signal.

Example 29 is the apparatus of any one of Examples 26 to 28, wherein the means to modulate the RTC signal includes: means to provide the modulated RTC signal with a first pulse width to indicate a start of a message; means to provide the modulated RTC signal with a second pulse width to indicate an end of a message; and means to maintain the modulated RTC signal with the second pulse width after the end of the message and until a start of a next message.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit disposed on a first circuit die, the circuit comprising:
    a real time clock (RTC) circuit to:
        receive a shared clock signal that is shared among a plurality of circuit dies including the first circuit die;
        receive clock information associated with the shared clock signal;
        generate a RTC signal, wherein a frequency of the shared clock signal is higher than a frequency of the RTC signal; and
        modulate the RTC signal to encode the clock information by adjustment of a pulse width of the RTC signal;
        provide the modulated RTC signal with a pre-defined pulse width to indicate an end of a message encoded by the modulated RTC signal; and
        maintain the modulated RTC signal with the pre-defined pulse width until a start of a next message; and
    an output terminal coupled to the RTC circuit to pass the modulated RTC signal to one or more other circuit dies of the plurality of circuit dies.

2. The circuit of claim 1, wherein the RTC circuit is to generate the RTC signal based on the shared clock signal.

3. The circuit of claim 1, wherein the clock information indicates a temperature associated with a clock circuit that generates the shared clock signal.

4. The circuit of claim 3, wherein the clock circuit includes a crystal oscillator.

5. The circuit of claim 1, wherein the RTC circuit is to adjust the pulse width by adjusting a timing of a falling edge of the RTC signal.

6. The circuit of claim 5, wherein the RTC circuit is to provide the modulated RTC signal with a first duty cycle over a first cycle to indicate that a first bit encoded by the modulated RTC signal is a first logic value and is to provide the modulated RTC signal with a second duty cycle over a second cycle to indicate that a second bit encoded by the modulated RTC signal is a second logic value, wherein the second duty cycle is different than the first duty cycle and the second logic value is different than the first logic value.

7. The circuit of claim 5, wherein the modulated RTC signal is to encode a plurality of bits per cycle of the modulated RTC signal based on the pulse width of the modulated RTC signal.

8. The circuit of claim 5, wherein the modulated RTC signal further encodes a start of message indicator based on the pulse width of the modulated RTC signal.

9. The circuit of claim 5, wherein all duty cycles of the modulated RTC signal used to encode the clock information are between 45% and 55%.

10. A system comprising:
a crystal oscillator to generate a shared clock signal;
a plurality of circuit dies having respective circuitry, the plurality of circuit dies including a first circuit die having:
  a real time clock (RTC) circuit to:
    receive a shared clock signal that is shared among the plurality of circuit dies;
    receive clock information associated with the shared clock signal;
    generate a modulated RTC signal based on the shared clock signal, wherein the modulated RTC signal is modulated using pulse width modulation to encode the clock information, and wherein a frequency of the modulated RTC signal is less than a frequency of the shared clock signal;
    provide the modulated RTC signal with a pre-defined pulse width to indicate an end of a message encoded by the modulated RTC signal; and
    maintain the modulated RTC signal with the pre-defined pulse width until a start of a next message; and
    pass the modulated RTC signal to one or more other circuit dies of the plurality of circuit dies.

11. The system of claim 10, wherein the system further comprises a temperature sensor to detect a temperature value associated with the crystal oscillator, and wherein the clock information includes the detected temperature value.

12. The system of claim 10, wherein the RTC circuit is to generate the modulated RTC signal using pulse width modulation by adjusting a timing of a falling edge of the modulated RTC signal to indicate the encoded clock information while maintaining a timing of a rising edge of the modulated RTC signal.

13. The system of claim 10, wherein the modulated RTC signal is to encode a plurality of bits per cycle of the modulated RTC signal based on a pulse width of the modulated RTC signal.

14. The system of claim 10, wherein a duty cycle of the modulated RTC signal varies between a range of values that are between 45% and 55%.

15. The system of claim 10, wherein the plurality of circuit dies include a processor, a cellular radio frequency (RF) die, and a connectivity (CNV) die.

16. A circuit disposed on a first circuit die, the circuit comprising:
a first input terminal to receive a shared clock signal from a second circuit die;
a second input terminal to receive a modulated real time clock (RTC) signal that encodes clock information associated with the shared clock signal, wherein a frequency of the modulated RTC signal is less than a frequency of the shared clock signal, wherein the modulated RTC signal has a pre-defined pulse width to indicate an end of a message encoded by the modulated RTC signal, and wherein the pre-defined pulse width is maintained until a start of a next message; and
a decoder to decode the clock information from the modulated RTC signal.

17. The circuit of claim 16, wherein the modulated RTC signal is encoded using pulse width modulation, and wherein the decoder is to determine a duty cycle of the modulated RTC signal based on the shared clock signal.

18. The circuit of claim 16, wherein the clock information indicates a temperature associated with a crystal oscillator that generates the shared clock signal, and wherein the decoder is further to adjust the shared clock signal based on the temperature.

19. The circuit of claim 16, wherein the modulated RTC signal encodes multiple bits per cycle of the modulated RTC signal.

20. An apparatus comprising:
means to receive clock information associated with a shared clock signal that is to be used by a plurality of circuit dies, wherein the clock information includes temperature information;
means to modulate a real time clock (RTC) signal with the clock information by adjusting a timing of a falling edge of the RTC signal, wherein the RTC signal has a frequency that is less than a frequency of the shared clock signal, wherein the means to modulate the RTC signal includes:
  means to provide the modulated RTC signal with a first pulse width to indicate a start of a message;
  means to provide the modulated RTC signal with a second pulse width to indicate an end of a message; and
  means to maintain the modulated RTC signal with the second pulse width after the end of the message and until a start of a next message; and
means to distribute the modulated RTC signal to the plurality of circuit dies.

21. The apparatus of claim 20, wherein the means to modulate the RTC signal includes:
means to provide the modulated RTC signal with a first duty cycle over a first cycle to indicate that a first bit encoded by the modulated RTC signal is a first logic value; and
means to provide the modulated RTC signal with a second duty cycle over a second cycle to indicate that a second bit encoded by the modulated RTC signal is a second logic value, wherein the second duty cycle is different than the first duty cycle and the second logic value is different than the first logic value.

22. The apparatus of claim 20, wherein the modulated RTC signal is to encode a plurality of bits per cycle of the modulated RTC signal based on a duty cycle of the modulated RTC signal.

* * * * *